United States Patent
Pueschner et al.

(10) Patent No.: US 10,440,825 B2
(45) Date of Patent: Oct. 8, 2019

(54) CHIP CARD MODULE AND METHOD FOR PRODUCING A CHIP CARD MODULE

(71) Applicant: Infineon Technologies Austria AG, Villach (AT)

(72) Inventors: Frank Pueschner, Kelheim (DE); Peter Stampka, Burglengenfeld (DE); Jens Pohl, Bernhardswald (DE); Marcus Janke, Munich (DE)

(73) Assignee: Infineon Technologies Austria AG, Villach (AT)

( * ) Notice: Subject to any disclaimer, the term of this patent is extended or adjusted under 35 U.S.C. 154(b) by 115 days.

(21) Appl. No.: 15/620,866

(22) Filed: Jun. 13, 2017

(65) Prior Publication Data
US 2017/0359897 A1    Dec. 14, 2017

(30) Foreign Application Priority Data
Jun. 13, 2016    (DE) .................. 10 2016 110 780

(51) Int. Cl.
*G06K 19/077* (2006.01)
*H05K 1/11* (2006.01)
(Continued)

(52) U.S. Cl.
CPC ....... *H05K 1/181* (2013.01); *G06K 19/07722* (2013.01); *G06K 19/07733* (2013.01);
(Continued)

(58) Field of Classification Search
CPC ....... G06K 19/07722; G06K 19/07733; G06K 19/07737; G06K 19/07739;
(Continued)

(56) References Cited

U.S. PATENT DOCUMENTS 4,812,742 A * 3/1989 Abel .................. G01R 31/024
324/537
6,313,524 B1    11/2001 Pueschner et al.
(Continued)

FOREIGN PATENT DOCUMENTS

| | | |
|---|---|---|
| DE | 102014106062 A1 | 11/2015 |
| EP | 0902973 B1 | 10/2001 |
| EP | 0948815 B1 | 2/2002 |

OTHER PUBLICATIONS

"Identification cards—Integrated circuit(s) cards with contacts—Part1: Physical Characteristics", International Standard, Oct. 15, 1998, ISO/IEC7816-1, First edition, Switzerland.
(Continued)

*Primary Examiner* — Daniel I Walsh
(74) *Attorney, Agent, or Firm* — Viering, Jentschura & Partner mbB

(57) ABSTRACT

In various embodiments, a chip card module is provided. The chip card module includes a chip card module contact array having six contact pads that are arranged in two rows having three contact pads each in accordance with ISO 7816, and three additional contact pads that are arranged between the two rows. Each additional contact pad is electrically conductively connected to a respective associated contact pad from a row from the two rows.

13 Claims, 6 Drawing Sheets

(51) Int. Cl.
*H05K 1/18* (2006.01)
*H05K 3/40* (2006.01)
*H01R 12/71* (2011.01)
*H05K 1/02* (2006.01)
*H05K 3/46* (2006.01)

(52) U.S. Cl.
CPC . *G06K 19/07737* (2013.01); *G06K 19/07739* (2013.01); *G06K 19/07741* (2013.01); *G06K 19/07747* (2013.01); *G06K 19/07766* (2013.01); *G06K 19/07773* (2013.01); *H01R 12/714* (2013.01); *H05K 1/11* (2013.01); *H05K 1/113* (2013.01); *H05K 3/4007* (2013.01); *H05K 1/0275* (2013.01); *H05K 3/4608* (2013.01); *H05K 3/4694* (2013.01); *H05K 2201/086* (2013.01); *H05K 2201/09409* (2013.01); *H05K 2201/09445* (2013.01); *H05K 2201/09663* (2013.01); *H05K 2201/10098* (2013.01); *H05K 2201/10719* (2013.01)

(58) Field of Classification Search
CPC ....... G06K 19/07741; G06K 19/07747; G06K 19/07766; G06K 19/07773; H05K 1/181
See application file for complete search history.

(56) References Cited

U.S. PATENT DOCUMENTS

| | | | |
|---|---|---|---|
| 6,326,683 B1 | 12/2001 | Houdeau et al. | |
| 6,385,504 B1* | 5/2002 | Pintsov | G06Q 20/401 700/102 |
| 6,411,891 B1* | 6/2002 | Jones | G06Q 10/08 342/357.395 |
| 6,612,498 B1* | 9/2003 | Lipponen | G06K 7/0013 235/441 |
| 6,669,487 B1* | 12/2003 | Nishizawa | G06K 19/0719 361/737 |
| 7,313,460 B1* | 12/2007 | Prater | G06Q 10/087 700/213 |
| 8,079,528 B2* | 12/2011 | Song | G06K 19/07 235/380 |
| 8,517,264 B2* | 8/2013 | Cho | G06K 19/07 235/379 |
| D701,864 S * | 4/2014 | Lepp | D14/436 |
| 8,936,199 B2* | 1/2015 | Lepp | G06K 19/0719 235/487 |
| 9,317,831 B2* | 4/2016 | Silver | G06Q 10/08 |
| 9,390,299 B1* | 7/2016 | Beals | H01R 12/714 |
| D780,184 S * | 2/2017 | Beals | D14/436 |
| 9,946,967 B2* | 4/2018 | Florek | G06K 19/07345 |
| 2003/0024996 A1* | 2/2003 | Muehlberger | G06K 7/0004 235/492 |
| 2003/0085287 A1* | 5/2003 | Gray | G06K 19/072 235/492 |
| 2003/0132296 A1* | 7/2003 | Silver | G06Q 10/08 235/385 |
| 2003/0146854 A1* | 8/2003 | Jones | G06Q 10/08 340/988 |
| 2003/0155414 A1* | 8/2003 | Silver | G06Q 10/08 235/375 |
| 2004/0089717 A1* | 5/2004 | Harari | G06F 13/387 235/441 |
| 2005/0218220 A1* | 10/2005 | Silver | G06Q 10/08 235/384 |
| 2005/0224588 A1* | 10/2005 | Ruping | G06K 7/0008 235/492 |
| 2005/0231921 A1* | 10/2005 | Noda | G06K 7/0021 361/737 |
| 2005/0252978 A1* | 11/2005 | Nishizawa | G06K 19/072 235/492 |
| 2006/0175417 A1* | 8/2006 | Ho | G06K 19/07 235/492 |
| 2007/0138301 A1* | 6/2007 | Cinkler | G06K 19/07733 235/492 |
| 2007/0145133 A1* | 6/2007 | Jolivet | G06K 7/0008 235/441 |
| 2007/0194134 A1* | 8/2007 | Shin | G06K 19/07 235/492 |
| 2008/0135626 A1* | 6/2008 | Reignoux | G06K 13/067 235/492 |
| 2008/0272197 A1* | 11/2008 | Nishizawa | G06K 19/005 235/492 |
| 2009/0124287 A1* | 5/2009 | Weiss | G06Q 20/3552 455/558 |
| 2009/0156254 A1* | 6/2009 | Montes | H04M 1/0202 455/558 |
| 2010/0102131 A1 | 4/2010 | Skowronek | |
| 2011/0022820 A1* | 1/2011 | Bunyk | B82Y 10/00 712/1 |
| 2011/0053637 A1* | 3/2011 | Filipovic | H04B 1/38 455/552.1 |
| 2013/0116009 A1* | 5/2013 | Schwandt | G06K 19/07732 455/558 |
| 2013/0175346 A1* | 7/2013 | Jenni | G06K 19/077 235/492 |
| 2013/0270349 A1* | 10/2013 | Lepp | G06K 19/0719 235/492 |
| 2014/0082247 A1* | 3/2014 | Buttner | G06K 7/0008 710/301 |
| 2014/0104133 A1* | 4/2014 | Finn | G06K 19/07769 343/866 |
| 2014/0117097 A1* | 5/2014 | Bosquet | G06K 7/0013 235/492 |
| 2014/0149308 A1* | 5/2014 | Ming | G06Q 10/0833 705/333 |
| 2014/0315399 A1* | 10/2014 | Bosquet | G06K 19/07739 439/76.1 |
| 2015/0076237 A1 | 3/2015 | Florek et al. | |
| 2015/0317553 A1 | 11/2015 | Pueschner et al. | |
| 2015/0324683 A1* | 11/2015 | Linfield | G06K 19/07769 235/492 |
| 2016/0309590 A1* | 10/2016 | Ding | G06F 1/1613 |
| 2017/0230695 A1* | 8/2017 | Curren | H04N 21/2543 |
| 2017/0270398 A1* | 9/2017 | Mathieu | G06K 19/07733 |
| 2017/0337401 A1* | 11/2017 | Beals | H05K 1/0209 |
| 2017/0359897 A1* | 12/2017 | Pueschner | H05K 1/113 |

OTHER PUBLICATIONS

"Information technology—Identification cards—Integrated circuit(s) cards with contacts13 Part2: Dimensions and location of the contacts", International Standard, Mar. 1, 1999, ISO/IEC7816-2, First edition, Switzerland.

Office Action issued in the corresponding German patent Application Nr. 102016110780.8, dated Jul. 22, 2019, 6 pages (reference purpose only).

* cited by examiner

CHIP CARD MODULE AND METHOD FOR PRODUCING A CHIP CARD MODULE

CROSS-REFERENCE TO RELATED APPLICATION

This application claims priority to German Patent Application Serial No. 10 2016 110 780.8, which was filed Jun. 13, 2016, and is incorporated herein by reference in its entirety.

TECHNICAL FIELD

Various embodiments relate generally to a chip card module and a method for producing a chip card module.

BACKGROUND

A conventional nano-SIM (Subscriber Identity Module) chip card module (the term nano-SIM is used herein for a chip card module having dimensions of 8.8 mm×12.3 mm standardized in accordance with ISO 7816 or a 4FF chip card module in accordance with ETSI specification TS 102 221 (with the same dimensions)) can typically be used for various applications, for example as a normal nano-SIM card, e.g. in a chip card module receptacle of a mobile phone.

Conventional chip cards for authentication of mobile apparatuses can have a nano-SIM chip card module that may be embedded in a card body. The chip card body may include a plastic material, for example PVC (polyvinyl chloride). In this case, the nano-SIM chip card module can be provided with what is known as active NFC functionality (Near Field Communication, which is used, by way of example, for transactions with a high security requirement, e.g. payments/credit transfers by means of a mobile phone).

The NFC functionality may also be incorporated in a piece of hardware of a mobile apparatus (e.g. of the mobile phone), for example as a permanently fitted chip card module, which may e.g. be soldered to a PCB, e.g. by means of a checkerboard-like arrangement of contact pads, which are also referred to as a "land grid array". Not all mobile apparatuses have a permanently incorporated functionality of this kind, however.

Whereas a nano-SIM chip card module that is intended to be introduced into a standard chip card module receptacle needs to provide contacts at the points standardized in accordance with ISO 7816 or ETSI TS 102 221, such a restriction is not necessary for nano-SIM chip card modules that are intended to be permanently incorporated, e.g. soldered.

When using a conventional nano-SIM chip card module for permanent incorporation on or in a printed circuit board (e.g. by means of surface mounting, also referred to as SMT (surface mount technology)), the chip card module is larger than is actually necessary (for example up to over 30%), which means that space is wasted on the printed circuit board.

However, it would be a great extravagance to produce two different nano-SIM chip card modules, one suitable for being held in a chip card module receptacle and one (a smaller one, e.g. with a surface area approximately 30% smaller) for permanent mounting on a printed circuit board.

Put another way, chip card modules having different form factors are needed, depending on whether there is provision for use in the chip card module receptacle or permanent incorporation.

Chip card modules having contact pad arrangements that are suitable for a chip card (in accordance with the ISO standard) and/or for SMD mounting are known from EP 0902973 B1 and EP 0948815 B1. These have no NFC functionality, however.

SUMMARY

In various embodiments, a chip card module is provided. The chip card module includes a chip card module contact array having six contact pads that are arranged in two rows having three contact pads each in accordance with ISO 7816, and three additional contact pads that are arranged between the two rows. Each additional contact pad is electrically conductively connected to a respective associated contact pad from a row from the two rows.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

In the detailed description that follows, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since components of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the detailed description that follows should not be interpreted in a restrictive sense, and the scope of protection of the present invention is defined by the appended claims.

Within the context of this description, the terms "connected" and "coupled" are used to describe both a direct and an indirect connection and a direct or indirect coupling. In the figures, identical or similar elements are provided with identical reference signs, insofar as this is expedient.

Figure 1A:
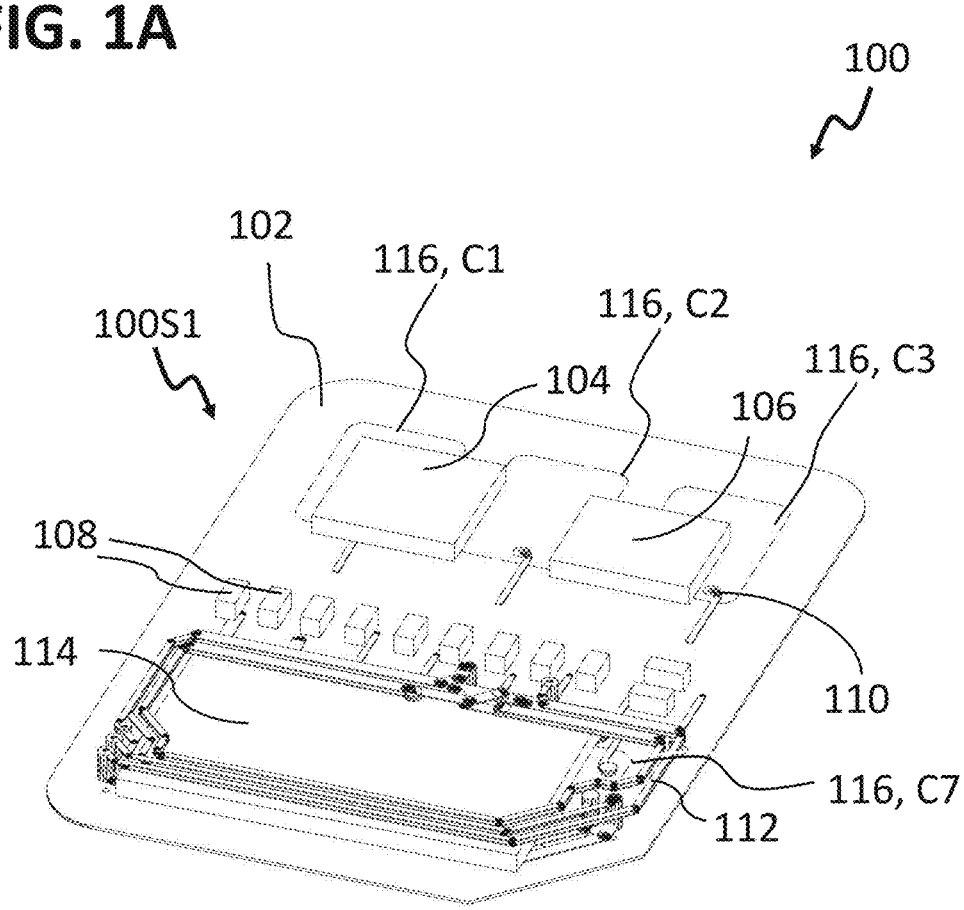
FIG. 1A shows a schematic perspective view of a conventional chip card module with embedded assemblies.

FIG. 1A shows a conventional chip card module 100 in a schematic perspective view as an oblique top view of a first side 100S1 of the chip card module 100. The chip card module has a plurality of assemblies, which are depicted here as exposed from the first side 100S1, but which are typically concealed inside the chip card module 100, e.g. by means of encapsulation or embedding. By means of the assemblies, the chip card module can provide an, for example active, NFC functionality.

The chip card module 100 can have a (for example multilayer) support 102 that may include a plastic material or may essentially consist of a plastic material, for example PVC or any other material usually used and suitable as support material for a chip card module.

As one assembly, the chip card module 100 can have a security controller 104. The security controller 104 can provide a security-related functionality, for example an authentication protocol for authentication by means of NFC.

Further, the chip card module 100 can have a frontend assembly 106. The frontend assembly 106 can allow NFC communication with an external apparatus. By way of example, the frontend assembly 106 can use an antenna 112 (for example with a ferrite core 114) to actively send and/or receive information.

Further assembles 108, e.g. passive assemblies such as e.g. capacitors and/or inductances, may be provided in the chip card module 100, for example in order to allow or support an NFC functionality of the chip card module.

Figure 1B:
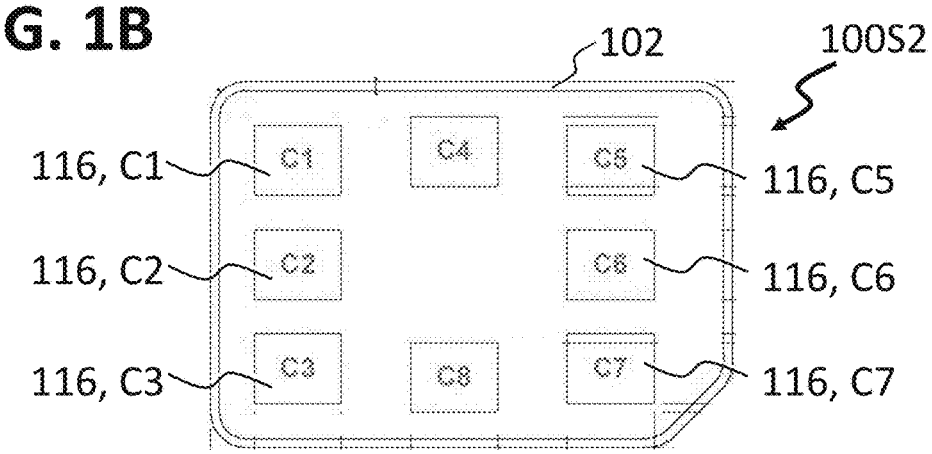
FIG. 1B shows a schematic depiction of contact pads arranged in accordance with ISO 7816 on a typical nano-SIM chip card module.

Arranged on a second side 100S2 of the chip card module 100, which is opposite the first side 100S1, there may be a plurality of contact pads 116. The contact pads are not visible from the first side 100S1 and are therefore indicated by dashed lines in FIG. 1A. The contact pads 116 may be arranged in accordance with ISO 7816 or ETSI specification TS 102 221. Such an arrangement is depicted in FIG. 1B. The plurality of contact pads 116 are typically denoted by C1, C2, . . . , C8, usually only the contact pads C1 to C3 and C5 to C7 being used, and the contact pads C4 and C8 being provided for future use and sometimes (such as in the chip card module 100, for example) not being produced at all.

The contact pads 116 in FIG. 1B are depicted as they would appear in a plan view of the second side of the chip card module 100. Therefore, the contact pad C1, which may be arranged at a left-hand edge of the support 102 when viewed from the second side, may appear at the right-hand edge of the support when viewed from the first side 102S1, for example.

A plurality of the assemblies 104, 106, 108, 112, 114 may be arranged over or at least partly over a plurality of the contact pads 116. By way of example, the security controller 104 may be arranged over or partly over the contact pad C3 and/or the contact pad C2. By way of example, the frontend assembly 106 may be arranged over or partly over the contact pad C1 and/or the contact pad C2. By way of example, the antenna 112 with the ferrite core 114 may be arranged over or at least partly over the contact pads C5, C6, C7. "(Partly) over" is intended to be understood here to mean that respective areas of the assemblies and of the contact pads (partly) overlap in a plan view.

An electrically conductive connection between the plurality of the contacts pads 116 and the assemblies 104, 106, 108, 112, 114 may have been or can be provided by means of electrically conductive patterned layers (not visible in FIG. 1A) and/or by means of plated-through holes 110.

Although in many chip card modules the second side 100S2 having the contact pads is substantially completely (apart from insulating trenches between the contact pads) covered by the contact pads, actually only the regions marked by C1 to C8 in FIG. 1B are provided as the respective contact regions in accordance with ISO 7816 or ETSI specification TS 102 221.

Figure 2:
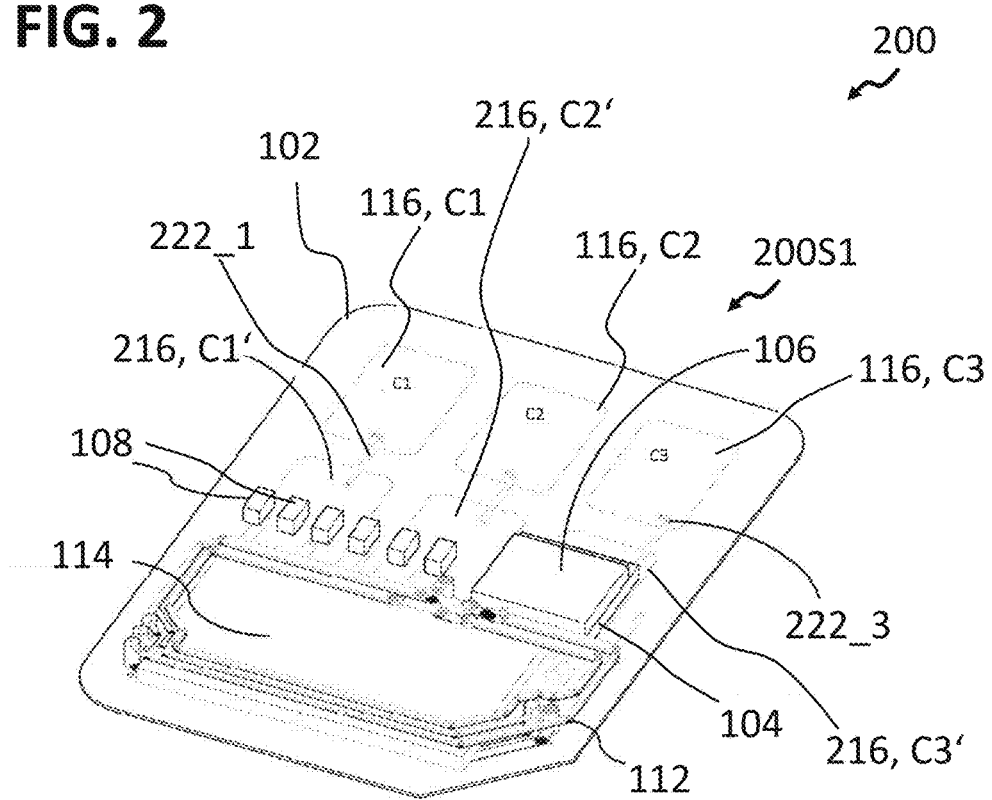
FIG. 2 shows a schematic perspective view of a chip card module with embedded assemblies in accordance with various embodiments.

Hence, a residual area on the second side (including the unused contact regions C4 and C8) can be used otherwise, for example as described in FIG. 2.

FIG. 2 shows a chip card module 200 with embedded assemblies in accordance with various embodiments in a schematic perspective view as an oblique top view of a first side 200S1 of the chip card module 200. The chip card module has a plurality of assemblies, which are depicted here as exposed from the first side 200S1, but which are typically concealed inside the chip card module 200, e.g. by means of encapsulation or embedding. By means of the assemblies, the chip card module can provide an, for example active, NFC functionality.

Figure 3:
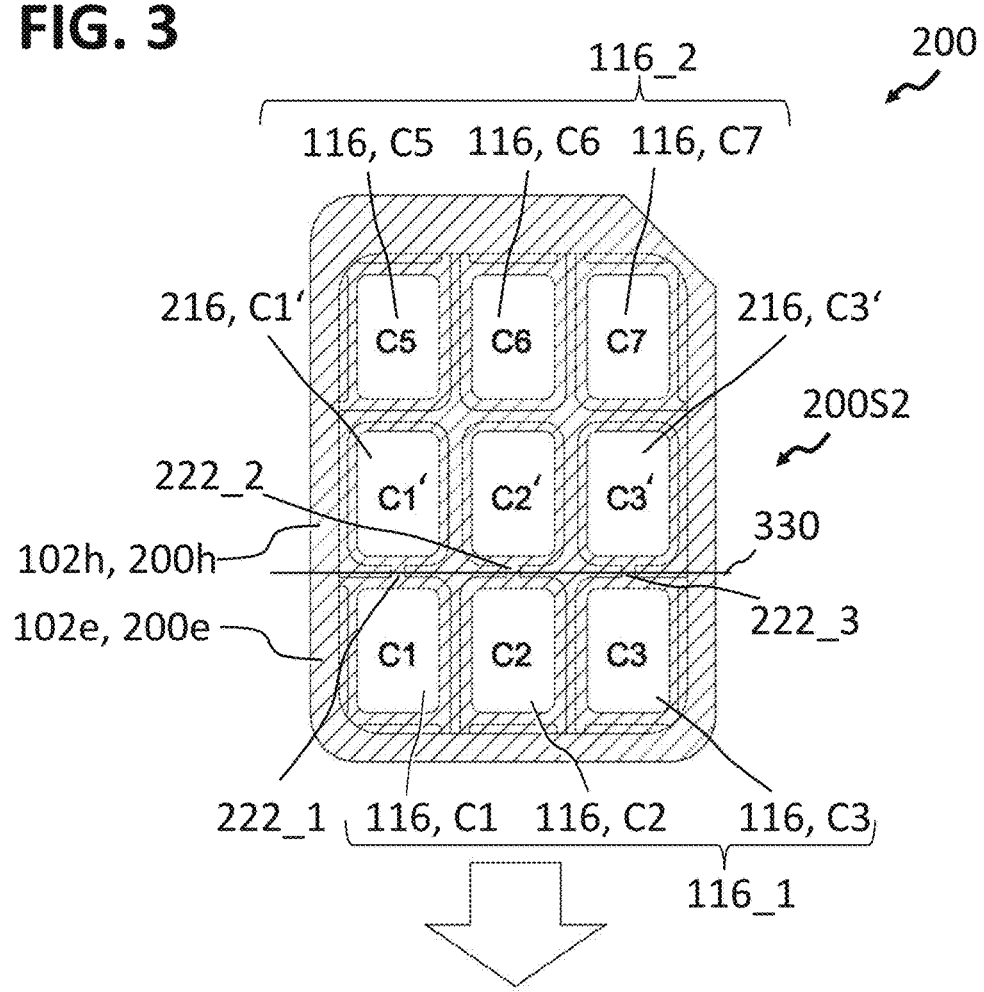
FIG. 3 shows a schematic depiction of a nano SIM chip card module in accordance with various embodiments.
Figure 3:
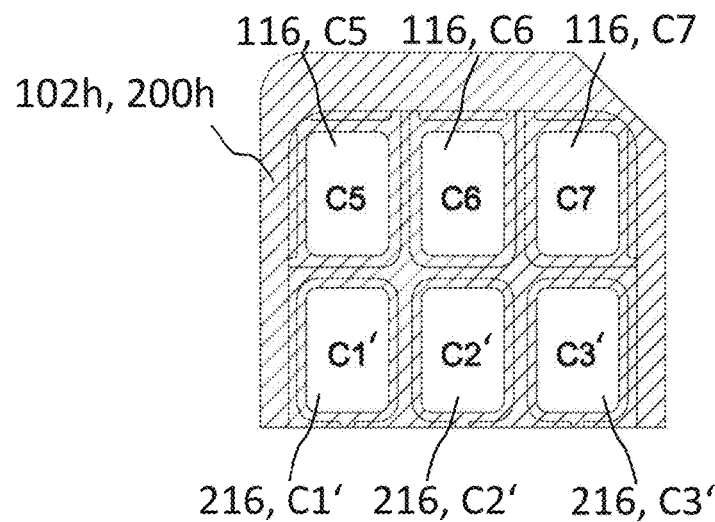

FIG. 3 shows a schematic view of a side 200S2, which is opposite the first side 200S1, of the nano-SIM chip card module 200 in accordance with various embodiments.

The chip card module 200 may correspond to the chip card module 100 in terms of multiple component parts, properties, materials, dimensions, etc., meaning that repetition is dispensed with to some extent.

The chip card module 200 can have a support 102 that may include a plastic material or may essentially consist of a plastic material, for example PVC or any other material usually used and suitable as support material for a chip card module. The support may include a dielectric material. The support 102 can have multiple layers of support material. Arranged over and/or between the multiple layers, there may be (e.g. patterned) conductive layers, e.g. metal layers, and/or the assemblies. The support 102 may be designed as a printed circuit board (PCB). The support 102 may be designed as PCB with embedded assemblies, in this regard see also FIG. 5A and FIG. 5B.

As one assembly, the chip card module 200 can have a security controller 104, which can be regarded as a specific type of chip. The security controller 104 can provide a security-related functionality, for example an authentication protocol for authentication by means of NFC. By way of example, an Infineon security controller from the product family SLE77 or SLE78 can be used, or any other suitable security controller, for example a security controller 104 as described in connection with FIG. 1A.

Further, the chip card module 100 can have a frontend assembly 106, which can be regarded as a specific type of chip. The frontend assembly 106 can allow NFC communication with an external apparatus. By way of example, the frontend assembly 106 can use an antenna 112 (for example with a ferrite core 114) to actively send and/or receive information. The frontend assembly 106 used may be an AMS AS3922 assembly, for example, which has what is known as "active boost technology", which can dispense with an external booster antenna for actively sending/receiving, or another frontend assembly 106 typically used for NFC applications.

Further assemblies 108, e.g. passive assemblies such as e.g. capacitors and/or resistors and/or inductances, may be provided in the chip card module 200, for example in order to allow or support an NFC functionality of the chip card module. By way of example, the further assemblies 108 can be used by means of the frontend assembly 106 in order to achieve tuning for the antenna 112.

Arranged on the second side 200S2, which is opposite the first side 200S1, of the chip card module 200 (see top of FIG. 3), there may be a plurality of contact pads 116. The contact pads are not visible from the first side 200S1 and are therefore indicated by dashed lines in FIG. 2, as in the case of the chip card module 100 shown in FIG. 1A. The contact pads 116, C1-C3 and C5-C7 may be arranged in accordance with ISO 7816, as described in connection with FIG. 1A and FIG. 1B. The contact pads 116 may, by way of example, be arranged as two rows 116_1, 116_2 having three contact pads each, for example a first row 116_1 from the two rows with the contact pads C1, C2, C3 and another row 116_2 from the two rows 116_1, 116_2 with the contact pads C5, C6, C7.

Unlike in the case of the conventional chip card module 100, the chip card module 200 in accordance with various embodiments can have three additional contact pads 216 that are arranged between the two rows 116_1, 116_2. In this case, each of the additional contact pads 216 may be electrically conductively connected to a respective associated contact pad 116 from a row from the two rows 116_1, 116_2, the three associated contact pads 116 being from the same row.

In a description for illustrative purposes, it is possible, in accordance with various embodiments, for the contact pads 116 of one of the two rows 116_1, 116_2 arranged in accordance with ISO 7816 to be duplicated in an interspace between the two rows 116_1, 116_2. An electrically conductive connection between a respective one of the additional contact pads and a respective (the directly adjacent) contact pad is used to stipulate which of the two rows 116_1, 116_2 is duplicated by means of the additional contact pads 216. By way of example, as depicted in FIG. 3, the row 116_1 (which has the contact pads C1, C2, C3) may be electrically conductively connected to the additional contact pads 216, so that the additional contact pads 216 are denoted as C1', C2' and C3'. In this case, C1 may be electrically conductively connected to C1' by means of an electrically conductive connection 222_1, C2 may be electrically conductively connected to C2' by means of an electrically conductive connection 222_2, and C3 may be electrically conductively connected to C3' by means of an electrically conductive connection 222_3. The contact pads C5, C6, C7 (denoted as 116_2) may in that case be designed such that they are not (or at least not directly) electrically conductively connected to the additional contact pads C1', C2' and C3'.

In accordance with various embodiments, the other row 116_2 (which has the contact pads C5, C6, C7) of the contact pads 116 may be electrically conductively connected to the additional contact pads 216, so that the additional contact pads 216 would be denoted as C5', C6' and C7' (not depicted). In this case, C5 may be electrically conductively connected to C5' by means of an electrically conductive connection, C6 may be electrically conductively connected to C6' by means of an electrically conductive connection, and C7 may be electrically conductively connected to C7' by means of an electrically conductive connection. The contact pads C1, C2, C3 of the row 116_1 may in that case be designed such that they are not (or at least not directly) electrically conductively connected to the additional contact pads C5', C6' and C7'.

Regardless of whether the additional contact pad arranged between the contact pad C1 and the contact pad C5 is connected to C1 and is denoted as C1', or is connected to C5 and is denoted as C5', the additional contact pad arranged between the contact pad C1 and the contact pad C5 can be referred to as the first additional contact pad. Regardless of whether the additional contact pad arranged between the contact pad C2 and the contact pad C6 is connected to C2 and is denoted as C2', or is connected to C6 and is denoted as C6', the additional contact pad arranged between the contact pad C2 and the contact pad C6 can be referred to as the second additional contact pad. Regardless of whether the additional contact pad arranged between the contact pad C3 and the contact pad C7 is connected to C3 and is denoted as C3', or is connected to C7 and is denoted as C7', the additional contact pad arranged between the contact pad C3 and the contact pad C7 can be referred to as the third additional contact pad.

The electrically conductive connections can, in accordance with various embodiments, include a metal, for example copper or another material typically used for conductive structures in chip card modules.

In accordance with various embodiments, the chip card module can have at least one chip, for example the security controller 104, the frontend assembly 106 and/or any other type of chip. The at least one chip may be directly or indirectly electrically conductively connected to each of the contact pads 116 and of the additional contact pads 216. By way of example, the security controller 104 and/or the frontend assembly 106 may be directly or indirectly electrically conductively connected at each of the contact pads 116 and of the additional contact pads 216.

In accordance with various embodiments, the at least one chip may be electrically conductively connected to each of the associated contact pads 116 by means of the respective additional contact pads 216 electrically conductively connected to the associated contact pad. By way of example, in accordance with embodiments depicted in FIG. 2 and FIG. 3, the security controller 104 and/or the frontend assembly 106 may be electrically conductively connected to the contact pad C1 by means of the additional contact pad C1', may be electrically conductively connected to the contact pad C2 by means of the additional contact pad C2', and may be electrically conductively connected to the contact pad C3 by means of the additional contact pad C3'.

The electrically conductive connections between the at least one chip, e.g. the security controller 104 or the frontend assembly 106, and further components of the chip card module 200, for example the contact pads 116, the additional contact pads 216, the passive assemblies 108 and/or the antenna 112, and possibly further assemblies, may have been or can be, in accordance with various embodiments, embodied in a known manner, for example (in this regard see also FIG. 5A and FIG. 5B) by means of one or more, for example patterned, electrically conductive layer(s) 566, vias 550, bonding wires 558, solder joints 556, and possibly other structures for electrically conductive connection that are typically used in chip card modules.

In accordance with various embodiments, the chip card module 200 can have two regions 200h, 200e, which can be referred to as the main region 200h and as the removal region 200e, wherein the at least one chip, e.g. the security controller 104 and the frontend assembly, the contact pads 116 from the other row 116_2 from the two rows 116_1, 116_2 and the additional contact pads 216 in the main region 200h may be arranged on or in an applicable support main region 102h, for example, and the contact pads 116 of the row 116_1 may be arranged in the removal region 200e, for example in an applicable removable support region 102e.

In accordance with various embodiments, the chip card module 200 may be designed such that a functionality of the chip card module 200 is maintained when the removable region 200e is removed or remote from the main region 200h.

In other words, in accordance with various embodiments, the chip card module 200 may be designed such that substantially all of the components necessary for operation of the chip card module 200 are located in the main region 200h of the chip card module 200, and the removal region 200e (apart from the substrate 102, possibly encapsulation material or the like) has only the duplicated contact pads 116_1 and possibly the electrically conductive connections 222_1, 222_2 and 222_3 (or a portion thereof).

The components that may be arranged in the main region 200h of the chip card module 200, e.g. on or in the support region 102h, may be the antenna 112, the ferrite core 114 of the antenna 112, the at least one chip, e.g. the security controller 104 and the frontend assembly 106, and/or the passive elements 108, e.g. capacitors, resistors and/or inductors.

In accordance with various embodiments, the removable region 200e may be free of the components needed for operation of the chip card module 200, e.g. the antenna 112, the ferrite core 114 and the antenna 112, the at least one chip, e.g. the security controller 104 and the frontend assembly 106, and/or the passive elements 108, e.g. capacitors, resistors and/or inductors.

A plurality of the assemblies 104, 106, 108, 112, 114 may, in accordance with various embodiments, be arranged over or at least partly over a plurality of the contact pads 116_2 and/or over a plurality of the contact pads 216. In a case as depicted in FIG. 2, an arrangement of the assemblies 104, 106, 108, 112, 114 may be chosen such that no assemblies are arranged over the contact pads C1, C2 and C3. If, in accordance with various embodiments, the additional contact pads 216 are the contact pads C5', C6', C7', then an arrangement of the assemblies 104, 106, 108, 112, 114 may be chosen such that no assemblies are arranged over the contact pads C5, C6 and C7.

An electrically conductive connection between the plurality of the contact pads 116, 216 and the assemblies 104, 106, 108, 112, 114 may be or have been provided by means of electrically conductive patterned layers (not visible in FIG. 1A) and/or by means of plated-through holes 110 and/or by means of bonding and/or by means of other suitable methods.

In accordance with various embodiments in which the at least one chip has a security controller 104 and a frontend assembly 106, the security controller 104 and the frontend assembly 106 may be arranged in a manner stacked on top of one another, as depicted in FIG. 3. This can allow all of the assemblies needed for operation of the chip card module 200 to be arranged in the main region 200h.

Hence, in accordance with various embodiments, the chip card module 200 can, on the one hand, be used in its original size, as depicted in FIG. 3 (top), for example, in order to make contact, by means of the contact pads 116 arranged in accordance with ISO 7816, with matching mating contacts of a receptacle for holding the chip card module 200, or in order to permanently mount the chip card module 200 by means of the contact pads 116, for example to solder it onto a printed circuit board. On the other hand, the additional contact pads 216 allow the chip card module 200 to be reduced in size, for example to approximately ⅔ of an original surface area of the chip card module 200, by means of removal, e.g. detachment, of the removable region 200e, and allow the reduced chip card module, which now has only the main region 200h with the unduplicated contact pads 116_2 and the additional contact pads 216, to be used, for example for permanent mounting, e.g. on a printed circuit board.

In accordance with various embodiments, the chip card module 200 can have a separating region 330 that may be arranged between the main region 200h and the removable region 200e. That is to say that the separating region 330 may be arranged between the row having the additional contact pads 216 and the row 116_1 of the contact pads that are connected to the additional contact pads 216.

In accordance with various embodiments, the separating region 330 may be free of electronic assemblies. The separating region 330 may, in various embodiments, be a one-dimensional separating region 330 (a line), as depicted e.g. in FIG. 3. In accordance with various embodiments, the separating region 330 may be a two-dimensional separating region 330 (an area) (not depicted). The separating region 330 may be suitable for separating the chip card module 200 into the main region 200h and the removable region 200e in the separating region 330.

In the separating region 330, it is also possible (apart from e.g. the support 102) for the electrically conductive connections 222_1, 222_2, 222_3 to run between the additional contact pads 216 and the respective associated contact pads of the row 116_1. When the chip card module 200 is separated in the separating region 330, the electrically conductive connections 222_1, 222_2, 222_3 can likewise be severed. Since the at least one chip, e.g. the security controller 104 and/or the frontend assembly 106, continues to be electrically conductively connected to the contact pads 216, the functionality of the chip card module can be ensured.

In accordance with various embodiments, the separating region 330 may be marked, for example by means of a print or another perceptible and/or measurable creation. In accordance with various embodiments, the separating region 330 can have a partial perforation or a perforation. The (partial) perforation may be designed such that the electrically conductive connections 222_1, 222_2, 222_3 are intact and a mechanical robustness of the chip card module 200 is impaired only insignificantly.

By means of the marking and/or perforation of the separating region 330, removal (e.g. detachment) of the removable region 200e may be easier and/or more reliable.

Figure 4A:
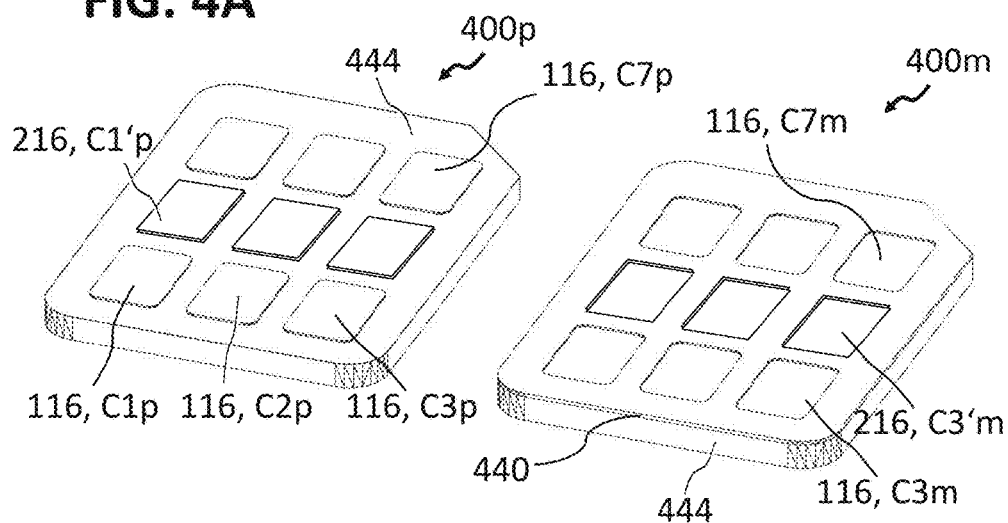
FIG. 4A shows schematic perspective depictions of two chip card modules in accordance with various embodiments.
Figure 4B:
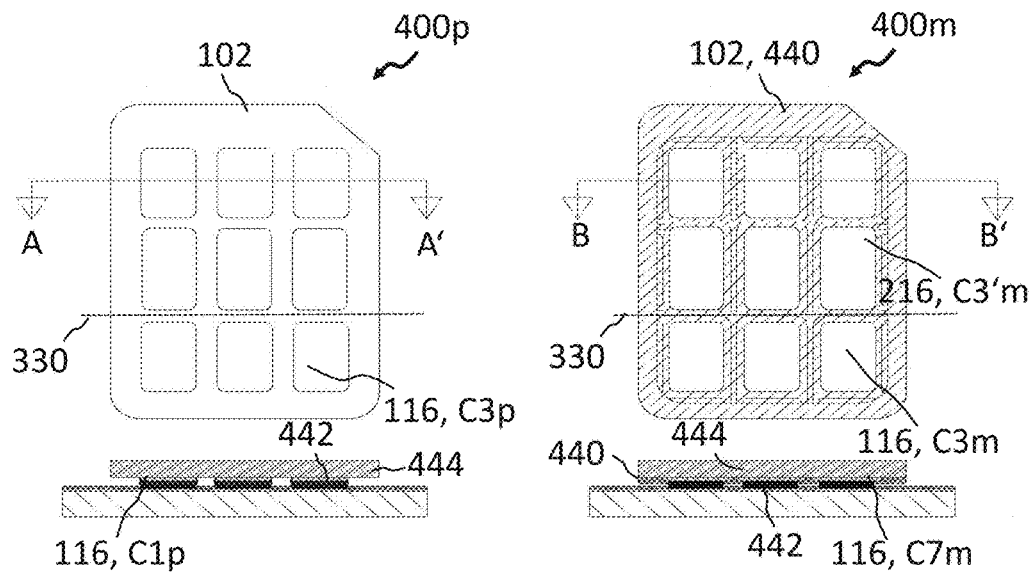
FIG. 4B shows a schematic plan view and a schematic cross sectional view in each case for two chip card modules in accordance with various embodiments.

FIG. 4A shows schematic perspective depictions of two chip card modules 400p, 400m in accordance with various embodiments, and FIG. 4B shows a schematic plan view and a schematic cross sectional view in each case for the two chip card modules 400p, 400m.

The chip card modules 400p, 400m in FIG. 4A substantially correspond to the chip card module 200 from FIG. 2 and FIG. 3. Repetitions of descriptions are therefore substantially dispensed with.

In various embodiments, it is possible, as shown from the left-hand chip card module 400p in FIG. 4A, for the contact regions to be defined by means of the contact pads 116, 216, for example by means of a shape of the contact pads 116, 216. By way of example, the contact pads may be formed substantially or exclusively in the regions defined in accordance with ISO 7816 or ETSI specification TS 102 221. By way of example, the contact pads 116, 216 may be formed such that they project from an area of the chip card module 400p that may be formed by the support 102 and/or an encapsulation material, for example. Such a design is also referred to as contact-pad-defined.

In various embodiments, a solder mask may be superfluous with such a or a similar design of the contact pads 116, 216. Accordingly, it may be possible for a chip card module body 444, which can have a packing, e.g. an encapsulation for a chip card module core (see FIG. 5A and FIG. 5B), for example, to be made thicker, so that the chip card module 400*p* may be more robust and more rigid.

In various embodiments, for example when there is the contact-pad-defined chip card module 400*p*, it may be necessary to route a signal from components embedded in the chip card module 400*p* (e.g. from the at least one chip (e.g. the security controller 104 and the frontend assembly 106), the plurality of passive assemblies 108 and/or the antenna 112) on a layer situated inside the chip card module 400*p*, for example an electrically conductive layer. Contact with the contact pads may have been or can be made by means of a via contact (for example by means of a via dummy contact), for example. The via contact may be arranged in a region of the contact pads 116, 216, for example, i.e. in a region that is situated between the respective contact pad 116, 216 and a side of the chip card module 400*p* that is opposite the side with the contact pads.

In various embodiments, it is possible, as depicted for the chip card module 400*m*, for the contact regions to be defined by means of a solder mask 440, for example by means of a mask 440 that is arranged or produced on a side of the chip card module that has the contact pads 116, 216 (i.e. on the second side of the chip card module 400*m*), and is shaped such that the regions defined in accordance with ISO 7816 or ETSI specification TS 102 221 are exposed, so that solder material in the mask 440 can be or may have been arranged over the defined regions.

In various embodiments, an outer metal layer can be used for the contact regions defined by means of the solder mask 440 in order to route a signal from components embedded in the chip card module 400*m* (e.g. from the at least one chip (e.g. the security controller 104 and the frontend assembly 106), the plurality of passive assemblies 108 and/or the antenna 112) to the external contact pads 116, 216.

Figure 5A:
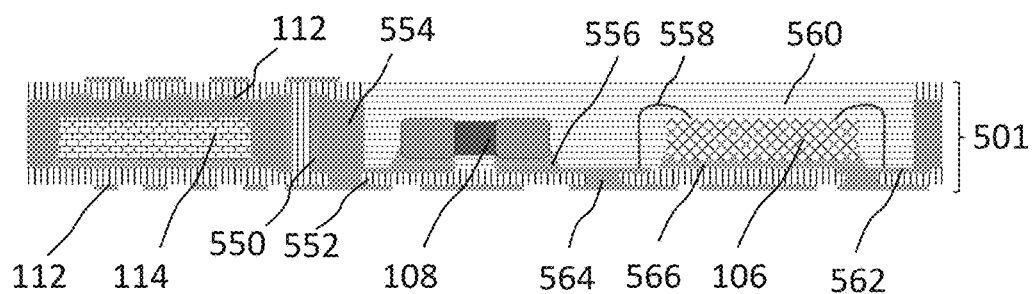
FIGS. 5A and 5B show schematic cross sectional views of chip card module cores in accordance with various embodiments.
Figure 5B:
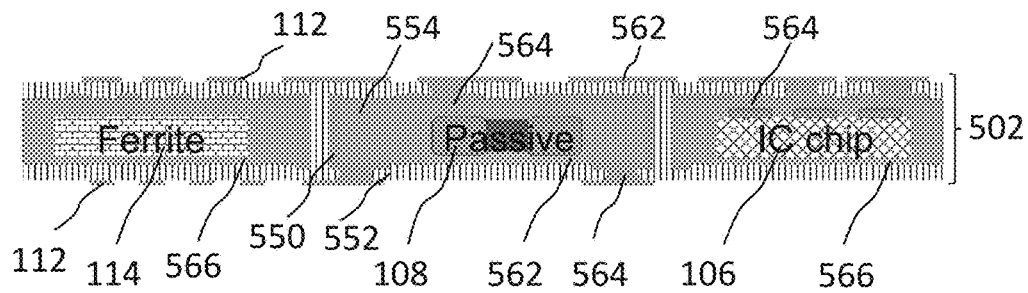

FIG. 5A and FIG. 5B show schematic cross sectional views of chip card module cores 501, 502 in accordance with various embodiments.

A chip card module core 501, 502 is understood herein to mean what is arranged inside a packaged e.g. encapsulated, chip card module in accordance with the embodiments above, i.e. for example a chip card module without the contact pads 116, 216 (and possibly without one or more dielectric layer(s), plated-through holes (vias) and/or patterned electrically conductive layers, e.g. metal layers, e.g. copper layers, which may still be needed for connection in the contact pads 116, 216), and without an outermost packaged layer.

The chip card module cores 501, 502 depicted in FIG. 5A and FIG. 5B may each be part of the chip card modules in accordance with various embodiments.

Repetition of a description of components that have been explained with reference to FIGS. 1 to 4B is dispensed with.

As depicted in FIG. 5A and FIG. 5B, chip card modules in accordance with various embodiments may be designed as a PCB having at least partly embedded components.

In FIG. 5A, it is possible, by way of example, for the antenna 112 with the ferrite core 114 to be embedded in the PCB 552, 554, 562, while the passive assemblies 108 may be mounted and electrically connected on the PCB 552, 554, 562 by means of an electrically conductive material 556 (e.g. a solder material), and the at least one chip, e.g. the security controller 104 (not depicted) and/or the frontend assembly 106, may be mounted by means of a mounting material, e.g. by means of a thermally conductive adhesive material, for example, and electrically connected by means of bonding wires. The mounted assemblies 108, 106 that are not embedded in the PCB may have been or can be encapsulated by means of an encapsulation material 560. An electrically conductive connection between a first side and a second side of the chip card module core may be provided in various embodiments by means of plated-through holes (vias) 550.

In FIG. 5B, it is possible, by way of example, for all the assemblies, e.g. the antenna 112 with the ferrite core 114, the passive assemblies 108 and the at least one chip, e.g. the security controller 104 (not depicted) and/or the frontend assembly 106, to be embedded in the PCB 552, 554, 562. An electrically conductive connection to the passive assemblies 108 or to the at least one chip, e.g. the security controller 104 (not depicted) and/or the frontend assembly 106, may be provided by means of vias, e.g. by means of via dummy contacts 564. An electrically conductive connection between a first side and a second side of the chip card module core may be provided in various embodiments by means of plated-through holes 550.

Figure 6:
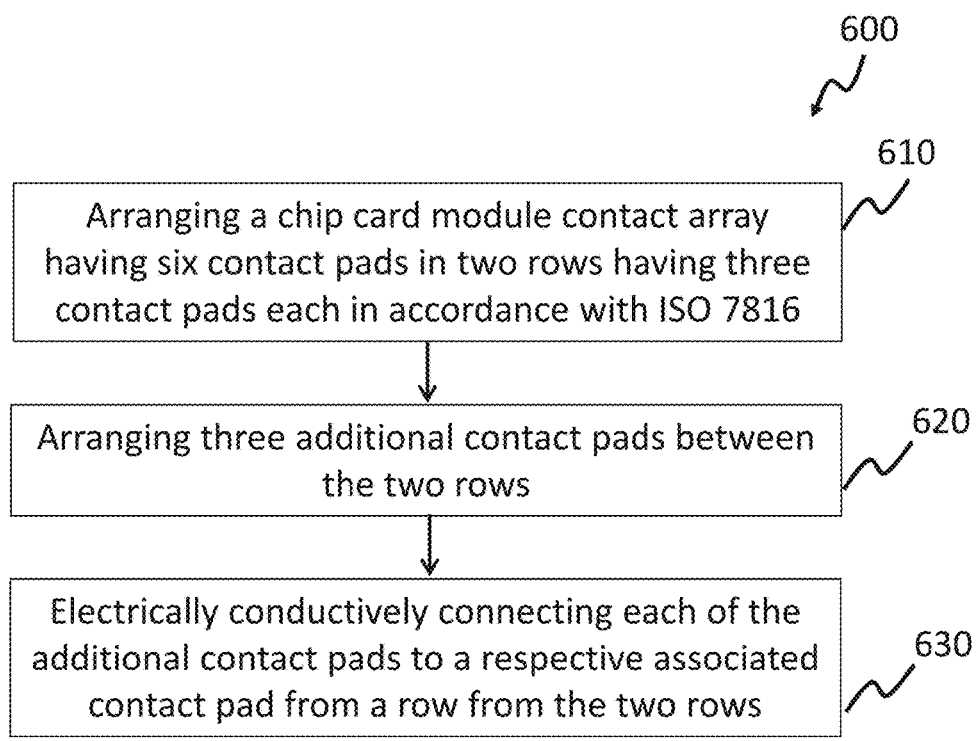
FIG. 6 shows a flowchart for a method for producing a chip card module in accordance with various embodiments.

FIG. 6 shows a flowchart 600 for a method for producing a chip card module in accordance with various embodiments.

The method can involve arranging a chip card module contact array having six contact pads in two rows having three contact pads each in accordance with ISO 7816 (in 610), arranging three additional contact pads between the two rows (in 620), and electrically conductively connecting each of the additional contact pads to a respective associated contact pad from a row from the two rows (in 630).

Further advantageous configurations of the method arise from the description of the apparatus, and vice versa.

In various embodiments, a nano-SIM chip card module is provided that provides an NFC capability for mobile apparatuses without an incorporated NFC capability. For this purpose, the nano-SIM chip card module can have all the assemblies that are also used for active NFC with hardware-based security, e.g. a security controller (e.g. Infineon SLE77, SLE78), a frontend assembly with what is known as "active boost technology" (e.g. AS3922), a booster antenna, which can have antenna windings and a ferrite core, and passive assemblies, e.g. for tuning the antenna.

In various embodiments, an NFC functionality may be provided by means of a PCB (printed circuit board) of a mobile device (e.g. a mobile phone, a tablet or the like), so that a nano-SIM chip card module receptacle of the device can remain available.

In various embodiments, a single chip card module can be provided that provides two form factors: first, a form factor that is expected by a nano-SIM chip card module receptacle and that uses a plurality of contacts arranged on the chip card module in accordance with ISO 7816, also referred to as contact pads, and secondly a form factor having a smaller surface area, which can be used for SMT mounting and uses additional contacts (contact pads) arranged on the chip card module.

In various embodiments, it is also possible to use the contact pads arranged in accordance with ISO 7816 (ISO contact pads for short) for SMT mounting.

In various embodiments, the chip card module can be reduced in size by more than approximately 30%, e.g. minimized, in a lateral direction in the case of SMT mounting. This also makes it possible for a surface area of the chip card module to be reduced in size by approximately 30%, e.g. minimized.

In various embodiments, the additional contact pads may be arranged between the ISO contact pads, which may be arranged in two rows having three contact pads each.

In various embodiments, the entire NFC functionality can be provided by means of a single component (by means of a single chip card module), saving space on the PCB on which the component (the chip card module) is mounted.

In various embodiments, a design complexity, a testing and qualification complexity and a logistical complexity that arise from a manufacturer of the chip card module can be minimized. The chip card module needs to be produced and tested or qualified with just one form factor. A decision about how the product is to be delivered (for example in blister tapes on rolls, also called "tape & reel" (T&R) packing, for SMD mounting, or in a carrier for ID1 format assemblies, for example, also called "ID1 format template carrier") can be made at a very late time in the production process, for example immediately before final packaging (e.g. encapsulation) or packing of the product.

In various embodiments, a chip card module having two form factors is provided by means of a special arrangement of the nano-SIM contacts and optional contacts in order to provide the standard nano SIM card form factor, the minimum contact regions defined in accordance with ISO 7816 or ETSI specification TS 102 221 being able to be exposed. Furthermore, the contact regions for SMD mounting may have a restricted size in order to fit a size of solder pads on a PCB on which the chip card module is mounted, it being additionally possible to significantly reduce the size of the packaged chip card module in a lateral direction.

In various embodiments, the contact regions may be defined by means of the contact pads, for example by means of a shape of the contact pads. By way of example, the contact pads may be formed substantially or exclusively in the regions defined in accordance with ISO 7816 or ETSI specification TS 102 221. In various embodiments, a solder mask may be superfluous. Accordingly, it may be possible to make a chip card module body, e.g. a packing (e.g. encapsulation) for a chip card module, thicker, so that the chip card module is more robust and more rigid. In various embodiments, the contact pads may be formed so as to project from an area of the chip card module.

In various embodiments, for example when there is a contact-pad-defined chip card module, it may be necessary to route a signal from components embedded in the chip card module on a layer situated within the chip card module, for example an electrically conductive layer, e.g. a metal layer. Contact for the contact pads may have been or can be made by means of a via contact (for example by means of a via dummy contact), for example. The via contact may be arranged in a region of the contact pads, for example, i.e. in a region that is situated between the respective contact pad and a side of the chip card module that is opposite the side with the contact pads.

In various embodiments, the contact regions may be defined by means of a solder mask, for example by means of a mask that is produced on one side of the chip card module, that has the contact pads and that is shaped such that the regions defined in accordance with ISO 7816 or ETSI specification TS 102 221 are exposed, so that solder material in the mask can be or may have been arranged over the defined regions.

In various embodiments, an outer metal layer can be used for the contact regions defined by means of the solder mask in order to route a signal from components embedded in the chip card module to the external contact pads.

In various embodiments, a chip card module is provided. The chip card module can have: a chip card module contact array having six contact pads, which are arranged in two rows having three contact pads each in accordance with ISO 7816, and three additional contact pads, which are arranged between the two rows, wherein each additional contact pad may be electrically conductively connected to a respective associated contact pad from a row from the two rows.

In various embodiments, the chip card module can further have at least one chip, wherein the at least one chip may be electrically conductively connected to each of the associated contact pads by means of the respective additional contact pad electrically conductively connected to the associated contact pad.

In various embodiments, the associated contact pad from the row is the respective contact pad from the row that may be directly adjacent to the additional contact pad.

In various embodiments, the row can have the ISO 7816 contact pads C1, C2 and C3, and the three additional contact pads can have a first additional contact pad (C1'), a second additional contact pad (C2') and a third additional contact pad (C3'), wherein the first additional contact pad (C1') may be electrically conductively connected to the contact pad C1, the second additional contact pad (C2') may be electrically conductively connected to the contact pad C2, and the third additional contact pad (C3') may be electrically conductively connected to the contact pad C3.

In various embodiments, the row can have the ISO 7816 contact pads C5, C6 and C7, and the three additional contact pads can have a first additional contact pad (C5'), a second additional contact pad (C6') and a third additional contact pad (C7'), wherein the first additional contact pad (C5') may be electrically conductively connected to the contact pad C5, the second additional contact pad (C6') may be electrically conductively connected to the contact pad C6, and the third additional contact pad (C7') may be electrically conductively connected to the contact pad C7.

In various embodiments, the chip card module can further have a main region and a removable region, wherein the at least one chip and the contact pads from the other row from the two rows and the additional contact pads may be arranged in the main region and the contact pads of the row may be arranged in the removable region.

In various embodiments, the chip card module may be designed such that a functionality of the chip card module is maintained when the removable region is removed from the main region.

In various embodiments, the chip card module can further have at least one assembly from a group of assemblies, the group having: a passive electronic assembly and an antenna, wherein the at least one assembly may be arranged in the main region.

In various embodiments, the at least one chip can have a security controller and a frontend assembly, wherein the security controller and the frontend assembly may be arranged in a manner stacked on top of one another.

In various embodiments, the chip card module can further have a separating region that is arranged between the main region and the removable region, wherein the separating region may be free of electronic assemblies.

In various embodiments, the electrically conductive connections of each additional contact pad to the respective associated contact pad of the row can run through the separating region.

In various embodiments, the separating region may be marked.

In various embodiments, a method for producing a chip card module is provided. The method may include: arranging a chip card module contact array having six contact pads in two rows having three contact pads each in accordance with ISO 7816, arranging three additional contact pads between the two rows, and electrically conductively connecting each of the additional contact pads to a respective associated contact pad from a row from the two rows.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip card module, comprising:
a chip card module contact array having six contact pads that are arranged in a first row and a second row, each of the first row and the second row comprising three contact pads, the three contact pads of the first row being arranged in accordance with positions for contacts C1, C2, and C3 in ISO 7816-2, and the three contact pads of the second row being arranged in accordance with positions for contacts C5, C6, and C7 in ISO 7816-2, and
three additional contact pads that are arranged between the two rows;
wherein each additional contact pad is electrically conductively connected to a respective associated contact pad from a row from the two rows; and
at least one chip;
wherein the at least one chip is electrically conductively connected to each of the associated contact pads by each respective additional contact pad electrically conductively connected to the associated contact pad;
wherein the chip card module further comprises a main region and a removable region removable from the chip card module;
wherein the at least one chip, three contact pads from the first row and the three additional contact pads are arranged in the main region and the three contact pads from the second row are arranged in the removable region.

2. The chip card module of claim 1,
wherein the associated contact pad from the row is the respective contact pad from the row that is directly adjacent to the additional contact pad.

3. The chip card module of claim 2,
wherein the row has the ISO 7816 contact pads C1, C2 and C3, and the three additional contact pads have a first additional contact pad, a second additional contact pad and a third additional contact pad, wherein the first additional contact pad is electrically conductively connected to the contact pad C1, the second additional contact pad is electrically conductively connected to the contact pad C2, and the third additional contact pad is electrically conductively connected to the contact pad C3.

4. The chip card module of claim 2,
wherein the row has the ISO 7816 contact pads C5, C6 and C7, and the three additional contact pads have a first additional contact pad, a second additional contact pad and a third additional contact pad, wherein the first additional contact pad is electrically conductively connected to the contact pad C5, the second additional contact pad is electrically conductively connected to the contact pad C6, and the third additional contact pad is electrically conductively connected to the contact pad C7.

5. The chip card module of claim 1,
wherein the chip card module is designed such that a functionality of the chip card module is maintained when the removable region is removed from the main region.

6. The chip card module of claim 1, further comprising:
at least one assembly from a group of assemblies, the group consisting of:
a passive electronic assembly; and
an antenna;
wherein the at least one assembly is arranged in the main region.

7. The chip card module of claim 1,
wherein the at least one chip has a security controller and a frontend assembly;
wherein the security controller and the frontend assembly are arranged in a manner stacked on top of one another.

8. The chip card module of claim 1, further comprising:
a separating region that is arranged between the main region and the removable region;
wherein the separating region is free of electronic assemblies.

9. The chip card module of claim 8,
wherein the electrically conductive connections of each additional contact pad to the respective associated contact pad of the row run through the separating region.

10. The chip card module of claim 8,
wherein the separating region is marked.

11. A method for producing a chip card module, the method comprising:
arranging a chip card module contact array having six contact pads arranged in a first row and a second row, each row having three contact pads, the three contact pads of the first row being arranged in accordance with positions for contacts C1, C2, and C3 in ISO 7816-2, and the three contact pads of the second row being arranged in accordance with positions for contacts C5, C6, and C7 in ISO 7816-2;
arranging three additional contact pads between the two rows;
electrically conductively connecting each of the additional contact pads to a respective associated contact pad from a row from the two rows; electrically conductively attaching at least one chip to each of the associated contact pads by each respective additional contact pad electrically conductively connected to the associated contact pad and forming a main of the chip card module comprising the at least one chip, three contact pads from the first row, and three additional contact pads and forming a removable region removable from the chip card module comprising the three contact pads from the second row.

12. The chip card module of claim 2,
wherein a number of additional contact pads is exactly three.

13. The chip card module of claim 2, wherein an electrical communication conduit directly connects an edge of each additional contact pad to an edge of each respective associated contact pad.

* * * * *